US007855388B2

United States Patent
Yen et al.

(10) Patent No.: US 7,855,388 B2
(45) Date of Patent: Dec. 21, 2010

(54) ALTERNATING CURRENT LIGHT-EMITTING DEVICE AND FABRICATION METHOD THEREOF

(75) Inventors: Hsi-Hsuan Yen, Hsinchu Hsien (TW); Wen-Yung Yeh, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 718 days.

(21) Appl. No.: 11/710,564

(22) Filed: Feb. 26, 2007

(65) Prior Publication Data

US 2008/0106212 A1 May 8, 2008

(30) Foreign Application Priority Data

Nov. 8, 2006 (TW) .............................. 95141256 A

(51) Int. Cl.
*H05B 37/00* (2006.01)
(52) U.S. Cl. .............................. 257/79; 257/82; 257/83; 257/84
(58) Field of Classification Search .................. 257/79, 257/82–84
See application file for complete search history.

(56) References Cited

U.S. PATENT DOCUMENTS

| 4,184,170 | A | 1/1980 | Burnham et al. |
| 6,547,249 | B2 | 4/2003 | Collins, III et al. |
| 6,957,899 | B2 | 10/2005 | Jiang et al. |
| 7,148,515 | B1 * | 12/2006 | Huang et al. ................... 257/84 |
| 2006/0094145 | A1 * | 5/2006 | Otsuka et al. .................. 438/31 |
| 2007/0131942 | A1 * | 6/2007 | Yen et al. ........................ 257/79 |
| 2009/0096386 | A1 * | 4/2009 | Yeh et al. ..................... 315/294 |
| 2009/0267085 | A1 * | 10/2009 | Lee et al. ....................... 257/88 |

FOREIGN PATENT DOCUMENTS

| CN | 1767220 A | 5/2006 |
| CN | 1799123 A | 7/2006 |
| TW | I259513 A | 3/1990 |
| TW | I252596 B | 11/1993 |
| TW | I250671 B | 3/1994 |
| WO | WO-2006/004337 A1 | 1/2006 |
| WO | WO 2006/095949 * | 9/2006 |
| WO | WO 2006/095949 A1 | 9/2006 |

* cited by examiner

*Primary Examiner*—A. Sefer
(74) *Attorney, Agent, or Firm*—Birch, Stewart, Kolasch & Birch, LLP

(57) ABSTRACT

An alternating current light-emitting device includes a substrate, a plurality of microdie light-emitting elements formed on the substrate, a rectifying element-dedicated member formed on a surface of a portion of microdie light-emitting elements, a rectifying unit formed on the rectifying element-dedicated member and provided with at least four rectifying elements forming a Wheatstone bridge circuit, and an electrically conductive structure electrically connecting the rectifying elements and the microdie light-emitting elements. With the rectifying unit being formed on the rectifying element-dedicated member, the rectifying elements are highly tolerant of reverse bias and feature low starting forward bias. Also, the present invention provides a method for fabricating an alternating current light-emitting device.

14 Claims, 4 Drawing Sheets

ALTERNATING CURRENT LIGHT-EMITTING DEVICE AND FABRICATION METHOD THEREOF

BACKGROUND OF THE INVENTION

1. Field of the Invention

The present invention relates to light-emitting devices, and more particularly, to an alternating current light-emitting device and a fabrication method thereof.

2. Description of the Prior Art

With continual advances in optoelectronic technology, light emitting diodes (LED), a kind of light sources, are in wide use and of vital importance to optoelectronic industry. In an AC-dominant living environment, conventional DC-driven LED chips can function well only in the presence of an external AC-to-DC converter circuit and a voltage drop element, thus resulting in high costs and unsatisfactory performance. This problem calls for development of AC-operated LED chips. AC-operated LED chips (AC LED) have been put forth by manufacturers based in the United States, Japan, South Korea and China since 2005, indicating that AC LED is deemed a novel component of great potential.

U.S. Pat. Nos. 6,547,249 and 6,957,899 and Taiwanese Patent Application No. 093126201 disclose a single chip having a plurality of miniaturized light-emitting diode dies connected to one another such that the chip is directly operated in a high-voltage AC environment, and the disclosures share features as follows: at least one AC microdie LED module formed on a chip, wherein the AC microdie LED module at least comprises two LED microdies electrically connected to one another, and under an applied alternating current the microdies emit light in turn in accordance with the way of circuit connection. Although the LED microdies function very well in an AC environment, each of the LED microdies emits light during half of a cycle. This means a waste of light-emitting area, as only half of the microdies are operating at a forward bias at every single instant in an AC environment.

To overcome the aforesaid drawback, a design of AC LED with an equivalent circuit like Wheaston's bridge was put forth, which involves disposing a light-emitting microdie module in a region of constant direction of rectified current to allow the light-emitting microdie to emit light whether the AC bias is forward or reverse. However, the design brought about another problem: LEDs have poor tolerance to a reverse bias, and thus rectification can only be achieved by LEDs when a large number of LEDs are used, which also results in a waste of microdie surface area.

Accordingly, the aforesaid drawbacks of the prior art call for immediate solution for directly fabricating on the surface of a LED die a rectifying element highly tolerant of reverse bias and characterized by low starting forward bias.

SUMMARY OF THE INVENTION

In light of the aforesaid drawbacks of the prior art, it is a primary objective of the present invention to disclose an alternating current light-emitting device with enhanced tolerance to a reverse bias and a fabrication method thereof.

Another objective of the present invention is to disclose an alternating current light-emitting device with enhanced unit area utilization and a fabrication method thereof.

Yet another objective of the present invention is to disclose an alternating current light-emitting device with a Wheatstone bridge circuit and a fabrication method thereof.

In order to achieve the above and other objectives, the present invention discloses an alternating current light-emitting device at least comprising: a substrate; a plurality of microdie light-emitting elements formed on the substrate, each of the microdie light-emitting elements at least being provided with an active layer and an electrically conductive terminal; a rectifying element-dedicated member formed on a surface of a portion of the microdie light-emitting elements; a rectifying unit formed on the rectifying element-dedicated member, provided with at least four rectifying elements forming a Wheatstone bridge circuit, and adapted to provide rectification and output a direct current signal to each of the microdie light-emitting elements; and an electrically conductive structure for electrically connecting the rectifying elements and the microdie light-emitting elements.

As regards the alternating current light-emitting device, the substrate is a chip or an insulated substrate, and the active layer is a light-emitting activity layer. The electrically conductive terminal of each of the microdie light-emitting elements is an Ohmic electrode. The rectifying element-dedicated member is a rectifying element-dedicated layer formed by epitaxy or deposition. The rectifying element-dedicated layer is preferably a semiconductor material AlGaN. The rectifying element-dedicated member is a rectifying element-dedicated region formed by doping a dopant into the substrate. The dopant is preferably an n-type dopant, and the rectifying element-dedicated region is formed by ion implantation or diffusion.

In a preferred embodiment, the microdie light-emitting elements are disposed in a matrix and connected in series, in parallel, or both according to the requirement for monochromatic light or light mixing. The microdie light-emitting elements emit light at identical or different wavelengths. The number of the microdie light-emitting elements used varies as appropriate, so as to vary the result of light mixing. In another preferred embodiment, each of the microdie light-emitting elements comprises a buffer layer, an n-type semiconductor, an active layer, and a p-type semiconductor. The electrically conductive structure is an electrically conductive bridge, a metallic wire-bonding structure, or a transparent metal oxide layer capable of electrical conduction. The rectifying element is a Schottky diode.

To achieve the aforesaid objectives, the present invention further discloses two methods for fabricating the alternating current light-emitting device.

The first fabrication method at least comprises the steps of: providing a substrate; forming on the substrate a plurality of microdie light-emitting elements at least provided with one active layer; forming on a surface of a portion of the microdie light-emitting elements a rectifying element-dedicated layer; forming on the rectifying element-dedicated layer a rectifying unit provided with at least four rectifying elements forming a Wheatstone bridge circuit; forming a groove for insulating the microdie light-emitting elements and the rectifying elements from one another; forming an electrically conductive terminal on each of the microdie light-emitting elements; and forming an electrically conductive structure for electrically connecting the rectifying elements and the electrically conductive terminals of the microdie light-emitting elements.

The first fabrication method further comprises the steps of defining regions of the rectifying elements on a surface of the rectifying element-dedicated layer by etching before forming the rectifying unit, and removing a residual portion of the rectifying element-dedicated layer thoroughly. The first fabrication method further comprises the steps of enclosing a periphery of the microdie light-emitting elements with a protective layer, and removing a portion of the protective layer so as to form the plurality of electrically conductive terminals penetrating the protective layer, wherein the protective layer is made of a dielectric material, such as $SiO_x$ and $SiN_x$.

The second fabrication method at least comprises the steps of: providing a substrate; forming on the substrate a plurality of microdie light-emitting elements at least provided with one active layer; doping a dopant into a surface of a portion of the microdie light-emitting elements to form a rectifying element-dedicated region by decreasing doping concentration; forming on the rectifying element-dedicated region a rectifying unit provided with at least four rectifying elements forming a Wheatstone bridge circuit; forming a groove by etching so as to insulate the microdie light-emitting elements and the rectifying elements from one another; forming an electrically conductive terminal on each of the microdie light-emitting elements; and forming an electrically conductive structure for electrically connecting the rectifying elements and the electrically conductive terminals of the microdie light-emitting elements. The second fabrication method further comprises the step of defining regions of the rectifying elements on the rectifying element-dedicated region by etching before forming the rectifying unit.

The method for fabricating the alternating current light-emitting device of the present invention comprises forming the rectifying unit on the rectifying element-dedicated member, wherein the rectifying element-dedicated member is formed on the substrate by epitaxy, deposition, diffusion, or implantation. Therefore, the rectifying elements are characterized by high tolerance to reverse bias and low starting forward bias, thereby reducing the number of the rectifying elements of the rectifying unit, providing more room for an increased number of microdie light-emitting elements, increasing unit area utilization, and enhancing light emission efficiency. Accordingly, the present invention overcomes a drawback of the prior art, that is, poor tolerance of conventional light-emitting microdies to reverse bias and a large number of light-emitting microdies required for rectification.

The embodiments below merely serve as the preferred embodiments of the present invention. The embodiments below should not be construed as to limit the scope of the present invention in any way. Hence, any other changes can actually be made in the present invention. It will be apparent to those skilled in the art that equivalent modifications or changes can be made to the present invention without departing from the spirit and the technical concepts disclosed by the present invention.

DETAILED DESCRIPTION OF THE PREFERRED EMBODIMENTS

Figure 1A:
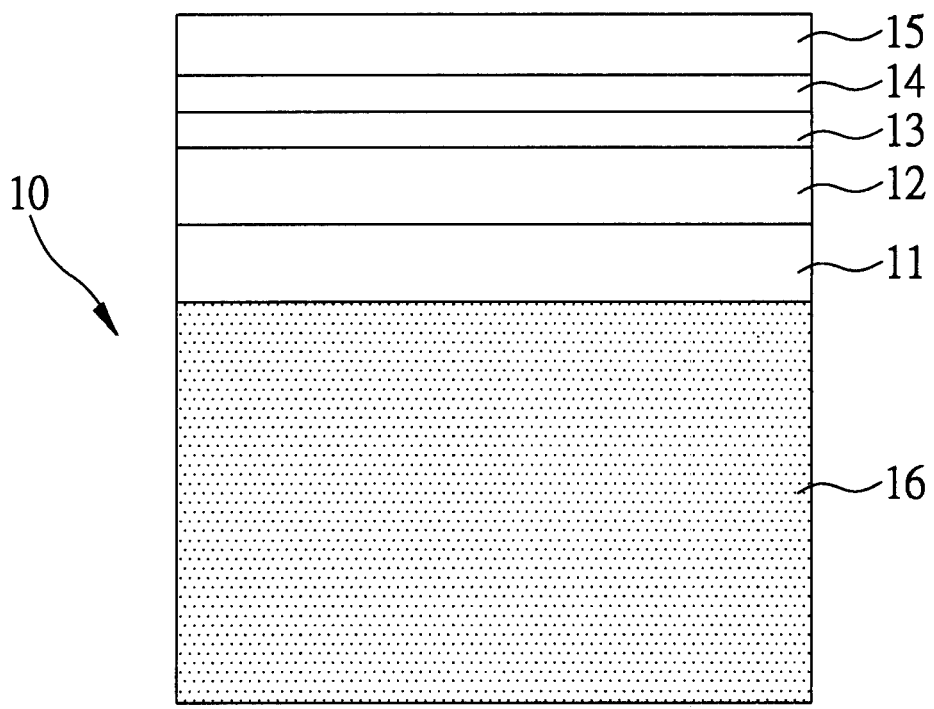
FIGS. 1A and 1B are side views showing structure of a rectifying element-dedicated layer above an active layer of an alternating current light-emitting device in accordance with the present invention.

The following specific embodiments are provided to illustrate the present invention. Persons skilled in the art can readily gain an insight into other advantages and features of the present invention based on the contents disclosed in this specification.

The present invention discloses an alternating current light-emitting device applicable to a substrate, for example, a chip. The alternating current light-emitting device is provided with a monochromatic or non-monochromatic light source by means of microdie light-emitting elements driven under an applied AC power rectified by, for example, a Wheatstone bridge circuit. The monochromatic or non-monochromatic light source is disposed on a light exit surface of the chip and is capable of full-time light emission. The alternating current is preferably the electricity supplied to the general public at voltages of 100V, 110V or 220V, and frequencies of 50 Hz or 60 Hz.

Referring to FIGS. 1A to 4B, which are schematic views showing embodiments of an alternating current light-emitting device and a fabrication method thereof in accordance with the present invention.

The present invention provides an alternating current light-emitting device at least comprising: a substrate 16; a plurality of microdie light-emitting elements 20a, 20b and 20d formed on the substrate 16, each of the microdie light-emitting elements 20a, 20b and 20d at least being provided with an active layer 13 and an electrically conductive terminal; a rectifying element-dedicated member, for example a rectifying element-dedicated layer 15 or a rectifying element-dedicated region 17, formed on a surface of a portion of the microdie light-emitting elements, for example the microdie light-emitting element 20d; a rectifying unit formed on the rectifying element-dedicated member and including at least four rectifying elements 203a electrically connected in a Wheatstone bridge circuit to provide a rectification function and output direct current (DC) signals to the microdie light-emitting elements 20a and 20b; and electrically conductive structures 23a and 23b selected from the group consisting of an electrically conductive bridge, a metallic wire-bonding structure, and a transparent metal oxide layer capable of electrical conduction and adapted to electrically connect the rectifying elements 203a and the microdie light-emitting elements 20a and 20b.

The substrate 16 can be a chip or an insulated substrate. The active layer 13 can be a light-emitting activity layer. The electrically conductive terminals of the microdie light-emitting elements 20a and 20b are Ohmic electrodes 201a, 201b, 202a, and 202b. The rectifying element-dedicated member is a rectifying element-dedicated layer 15 (FIG. 1A) made of semiconductive material such as AlGaN by epitaxy or deposition. The rectifying element-dedicated member can also be a rectifying element-dedicated region 17 (FIG. 1B) obtained by doping a dopant, preferably an n-type dopant, into the surface of a portion of the microdie light-emitting elements, for example the microdie light-emitting element 20d, by ion implantation or diffusion.

Referring to FIG. 1A, which shows an epitaxial structure of a microdie light-emitting element of an alternating current light-emitting device in accordance with the present invention, a microdie light-emitting element is made from a chip 10 by epitaxy (though a fabrication method disclosed in the present invention is not limited to epitaxy), the epitaxial structure of the chip 10 at least comprises a substrate 16, a buffer layer 11 formed on the substrate 16, an n-type semiconductor 12 on the buffer layer 11, an active layer 13 on the n-type semiconductor 12, a p-type semiconductor 14 on the active layer 13, and a rectifying element-dedicated layer 15 on the p-type semiconductor 14. Taking a GaN group semiconductor as an example, the rectifying element-dedicated layer 15 is preferably implemented by intrinsic semiconductor AlGaN or any similar semiconductor. The main purpose of the rectifying element-dedicated layer 15 is to provide material required for fabrication of the rectifying elements of the rectifying unit (not shown) such that the rectifying elements are characterized by high breakdown reverse bias and low starting forward bias.

Preferably, the substrate 16 is implemented by semiconductor materials, such as $Al_2O_3$, GaAs, GaP and SiC, and any insulated materials.

Figure 1B:
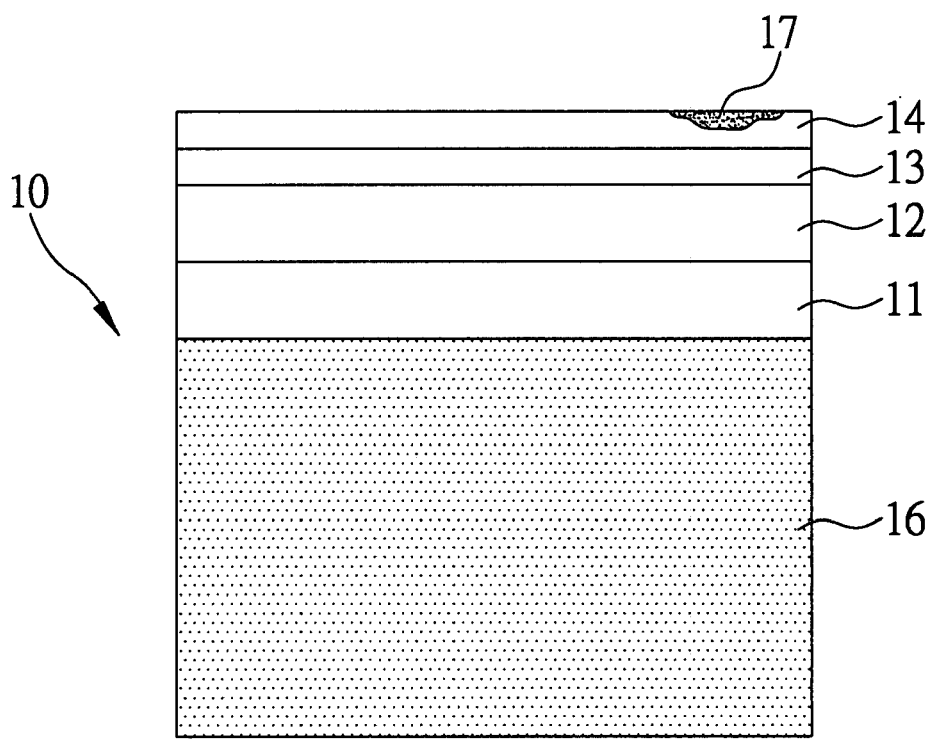

FIG. 1B depicts the structure of another microdie light-emitting element of an alternating current light-emitting device. Unlike what is illustrated with FIG. 1A, in FIG. 1B, a dopant is doped into a diode-based epitaxial surface of the chip 10 by ion implantation or diffusion to reduce the doping concentration thereof. Taking the GaN epitaxy in wide use as an example, although a GaN chip surface is typically p-doped, the present invention discloses doping a n-type dopant, such as Si, into a p-type GaN film by ion implantation or diffusion, and then, upon activation, the doping effect of the p-type and n-type dopants offsets one another to such an extent that the dopant concentration in the rectifying element-dedicated region 17 of the surface of the chip 10 decreases to approximately the dopant concentration of an intrinsic semiconductor, which is conducive to fabrication of a rectifying element (not shown).

Figure 2A:
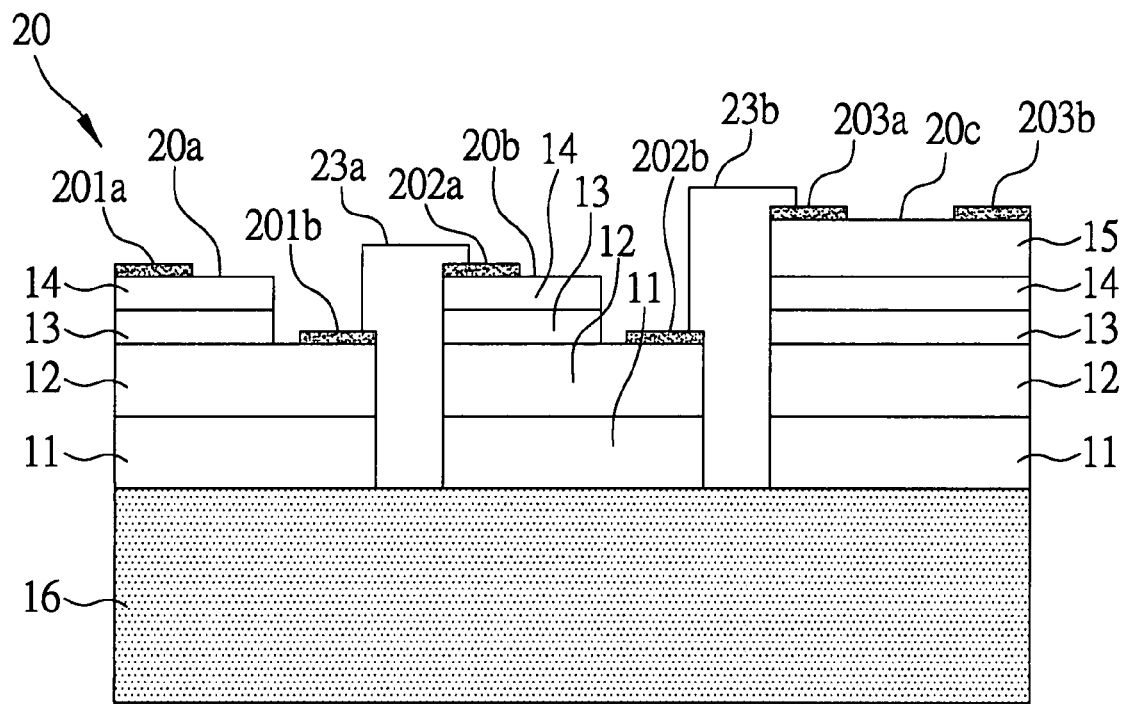
FIGS. 2A and 2B are side views showing die structure of microdie light-emitting elements of an alternating current light-emitting device in accordance with the present invention.

FIG. 2A is an exploded view showing the structure of neighboring microdie light-emitting elements of an alternating current light-emitting device 20 comprising microdie light-emitting elements 20a, 20b and 20d. The microdie light-emitting elements 20a and 20b each include at least one active layer 13. The active layer 13 is a light-emitting active layer. As shown in FIG. 2A, the surface of the microdie light-emitting elements 20a and 20b is not provided with the rectifying element-dedicated layer 15. The active layers 13 of the microdie light-emitting elements 20a and 20b are each provided with Ohmic electrodes 201a, 201b, 202a, and 202b. Alternating current applied to the Ohmic electrodes 201a, 201b, 202a, and 202b allows the active layers 13 to emit light.

A rectifying element 203a shown in FIG. 2A is formed on the surface of the microdie light-emitting element 20d, wherein the microdie light-emitting element 20d comprises at least one active layer 13. The rectifying element-dedicated layer 15 is disposed above the active layers 13 and configured for fabrication of electrodes related to the rectifying element 203a. The structure is fabricated by epitaxy, deposition, diffusion, or implantation. The rectifying element 203a is a Schottky rectifying electrode. Applying a forward bias to the rectifying element 203a in the direction of an Ohmic electrode 203b decreases potential barrier at a metal-semiconductor junction and therefore current passes the junction. Conversely, applying a forward bias to the Ohmic electrode 203b in the direction of the rectifying element 203a increases potential barrier at a metal-semiconductor junction and therefore current does not pass the junction. In doing so, rectification is achieved.

Electrically conductive structures 23a and 23b of FIG. 2A allow electrical connection to be formed between the microdie light-emitting elements 20a and 20b and the rectifying element 203a. The electrically conductive terminals of a microdie light-emitting element 20a comprises the Ohmic electrodes 201a and 201b connected to the Ohmic electrodes 202a and 202b of another microdie light-emitting element 20b through the electrically conductive structure 23a. The electrical connection between the microdie light-emitting elements 20a and 20b and the rectifying element 203a is formed by means of the electrically conductive structure 23b. The electrically conductive structures 23a and 23b are preferably an electrically conductive bridge.

Figure 2B:
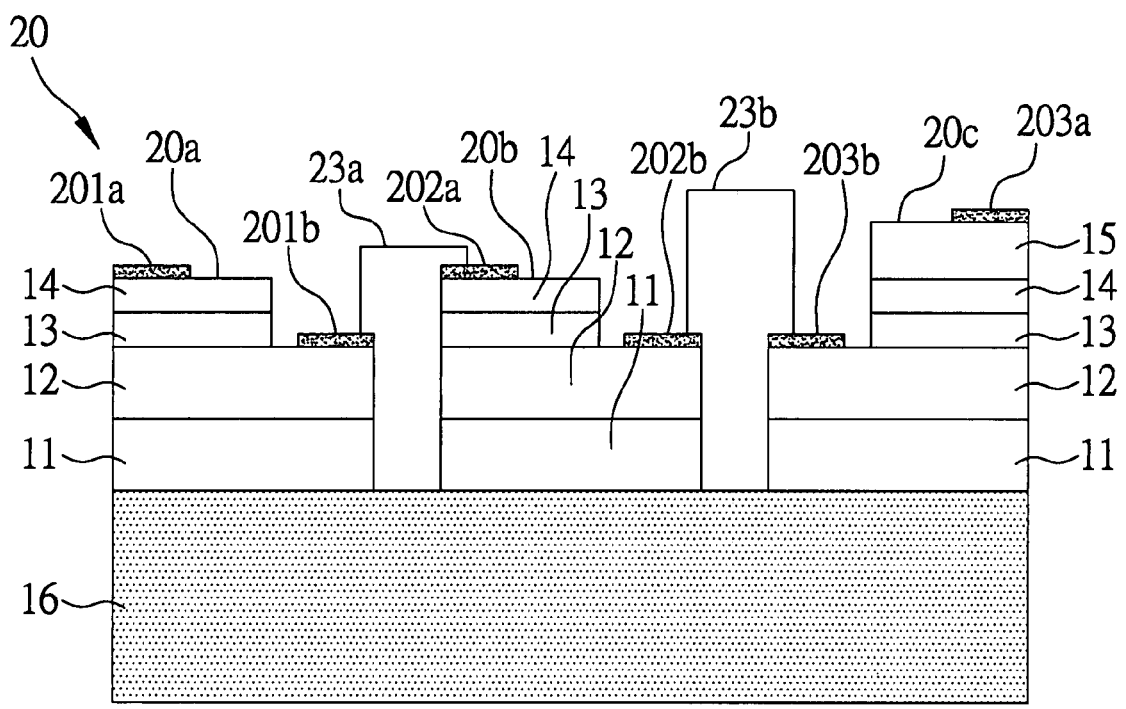

FIG. 2B is a schematic view showing another embodiment of the present invention. Unlike what are shown in FIG. 2A, FIG. 2B shows a single microdie with functions of rectification and light emission. The single microdie of FIG. 2B includes a complete structure of a microdie light-emitting element 20d, and the rectifying element-dedicated layer 15 and the rectifying element 203a formed thereon. The rectifying element 203a is a Schottky rectifying electrode and is formed on the rectifying element-dedicated layer 15. The Ohmic electrode 203b is formed on the n-type semiconductor 12 below the rectifying element 203a. In the presence of a forward bias, current passes the active layer 13 of the microdie light-emitting element 20d and enables the active layer 13 to emit light. In the presence of a reverse bias, the rectifying element 203a stops the passage of current and therefore achieves rectification. This embodiment achieves maximum light-emitting area by means of the simplest fabrication process.

Figure 3A:
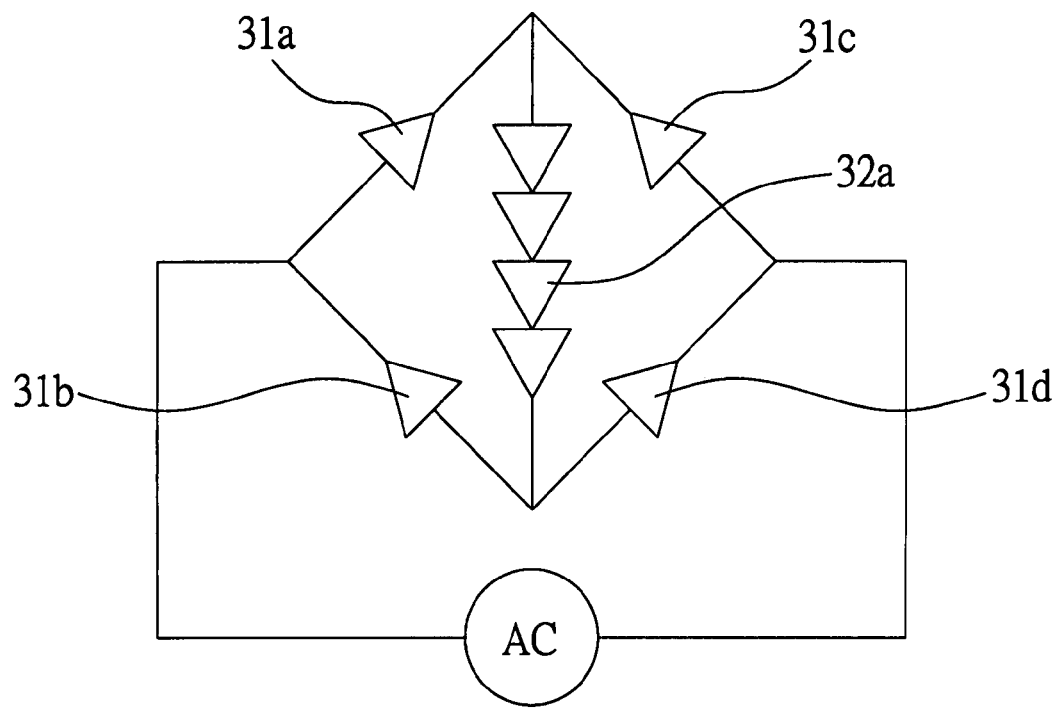
FIGS. 3A and 3B are schematic views showing an equivalent circuit of an alternating current light-emitting device in accordance with the present invention.
Figure 3B:
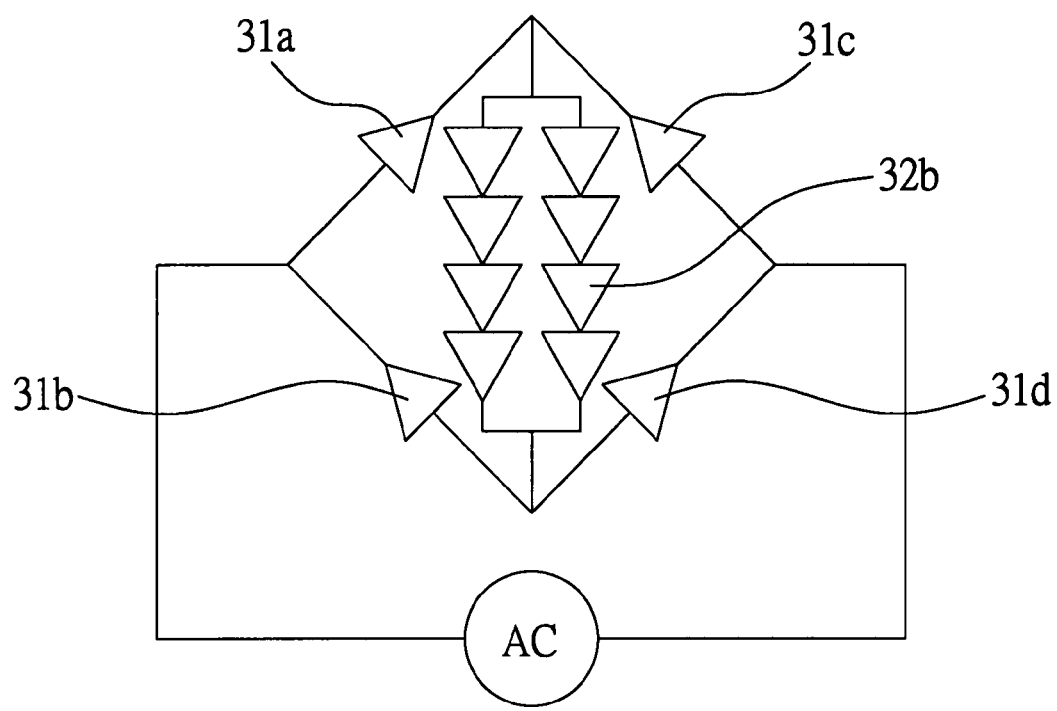

FIG. 3A is a schematic view showing an equivalent circuit of an alternating current light-emitting device equipped with rectifying elements. As shown in FIG. 3A, rectifying elements 31a, 31b, 31c and 31d are equivalent to the aforesaid rectifying elements 203a and are electrically connected to one another in a Wheatstone bridge circuit to form a rectifying unit 31. Alternating current inputted to an AC light-emitting module is rectified by the rectifying element 31a of the rectifying unit 31 before being inputted to a microdie light-emitting module 32a (including an appropriate amount of microdie light-emitting elements, like the microdie light-emitting element 20a), and then the alternating current is rectified by the rectifying element 31d, thereby allowing the microdie light-emitting module 32a to emit light under a constant forward bias. Likewise, alternating current rectified by the rectifying element 31c is inputted to the microdie light-emitting module 32a and then rectified by the rectifying element 31b, thereby allowing the microdie light-emitting module 32a to emit light under a constant reverse bias.

The way of electrical connection of the microdie light-emitting elements (for example, the microdie light-emitting elements 20a and 20b) of the microdie light-emitting module 32a shown in FIG. 3A is not limited to single-row series connection. For instance, the microdie light-emitting module 32b of the circuit schematically shown in FIG. 3B features double-row parallel/series connection. The microdie light-emitting module 32b of the present invention comprises monochromatic or multichromatic microdie light-emitting elements connected in series or in parallel; in other words, light mixing can be varied by selectively using an appropriate amount of microdie light-emitting elements emitting light of identical or different wavelengths.

Figure 4A:
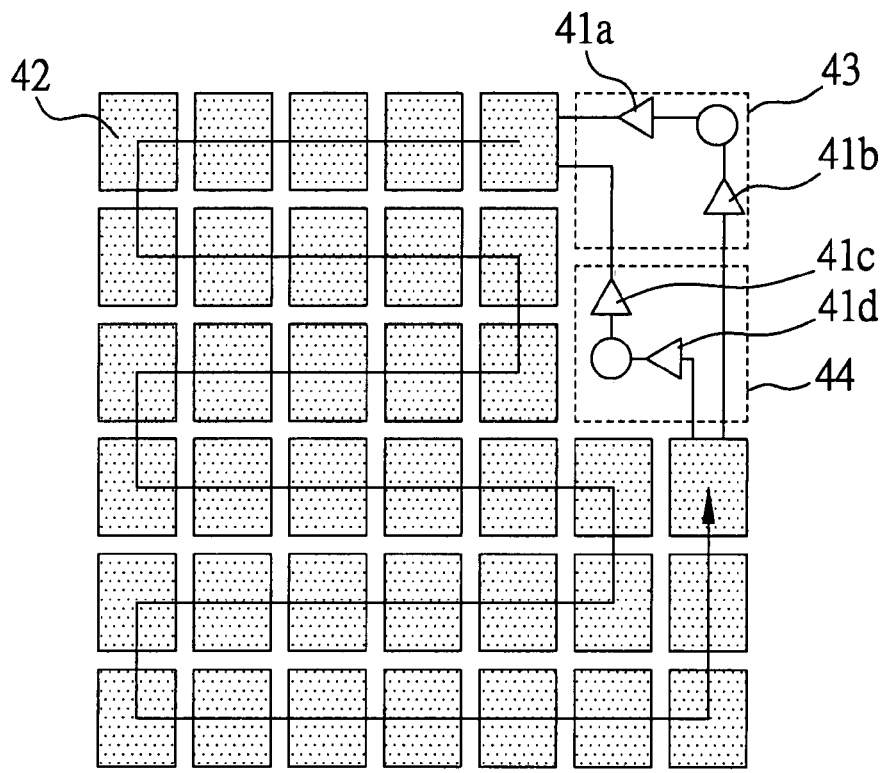
FIGS. 4A and 4B are top plan views schematically showing a layout of components of an alternating current light-emitting device in accordance with the present invention.

Referring to FIG. 4A, which is a top plan view schematically showing an embodiment of an alternating current light-emitting device equipped with a Wheatstone Bridge in accordance with the present invention, the alternating current light-emitting device comprises the rectifying elements 41a, 41b, 41c, and 41d, and, under different bias voltages, alternating current passes wire bonding electrodes 43 and 44 before entering the Wheatstone bridge circuit and then the microdie light-emitting elements 42. Doing so allows the microdie light-emitting elements 42 disposed in a matrix to stay at a constant forward bias operating condition so as to increase die surface utilization. As shown in FIG. 4A, the rectifying elements 41a, 41b, 41c, and 41d are disposed below the wire bonding electrodes 43 and 44, and thus previously unusable regions become capable of rectification. As a result, the light-emitting area of the alternating current light-emitting device (applicable to what is shown in FIG. 2A) increases.

Figure 4B:
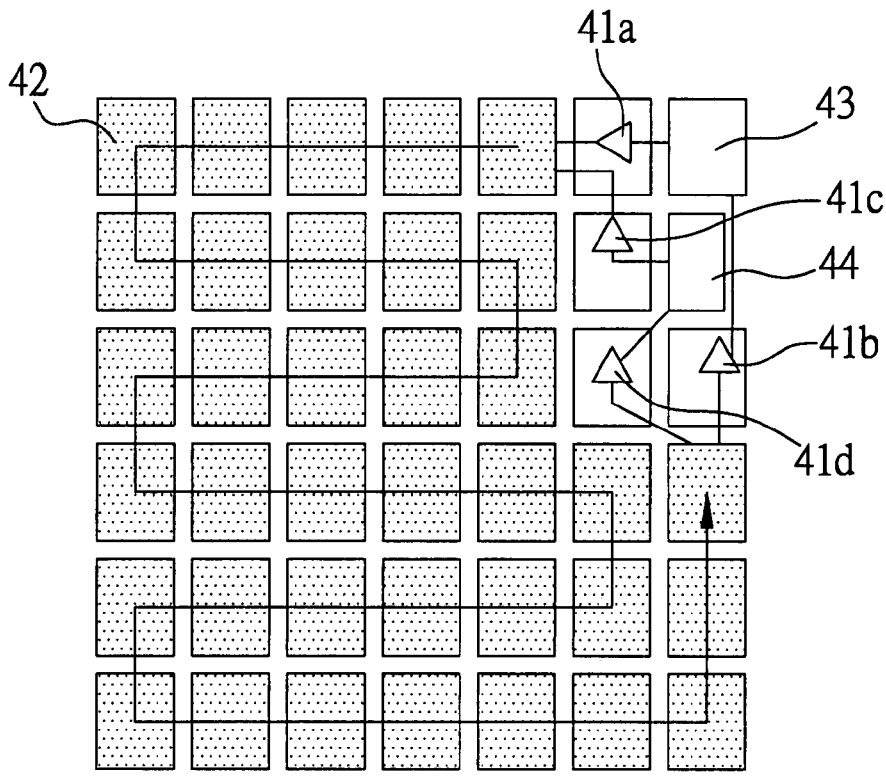

FIG. 4B illustrates another embodiment of the present invention. Unlike the embodiment shown in FIG. 4A, the embodiment of FIG. 4B is based on a combination of the rectifying elements 41a, 41b, 41c, and 41d and the microdie light-emitting elements 42, which allows the rectifying elements 41a, 41b, 41c, and 41d to emit light, and the rectifying elements 41a, 41b, 41c, and 41d emit light in the way as the remaining microdie light-emitting elements 42 do when connected to the wire bonding electrodes 43 and 44 and electrically conductive. As a result, the light-emitting area of the alternating current light-emitting device (applicable to what is shown in FIG. 2B) increases.

The present invention further discloses two methods for fabricating the alternating current light-emitting device. Related to FIG. 1A, the first fabrication method comprises: providing a substrate 16, forming on the substrate 16 the microdie light-emitting elements 20a, 20b and 20d having at least one active layer 13 by epitaxy, forming on a surface of the microdie light-emitting elements 20a, 20b and 20d a rectifying element-dedicated layer 15 by epitaxy or deposition; defining regions of the microdie light-emitting elements 20a, 20b and 20d on the die surface by etching, forming on the rectifying element-dedicated layer 15 a rectifying unit having at least four rectifying elements 203a forming a Wheatstone bridge circuit; removing the rectifying element-dedicated layer 15 from the surface of the microdie light-emitting elements 20a and 20b thoroughly; forming a groove by dry etching or wet etching so as to insulate the microdie light-emitting elements 20a, 20b and 20d from one another; enclosing a periphery of the microdie light-emitting elements 20a, 20b and 20d with a protective layer, removing a portion of the protective layer so as to form the plurality of electrically conductive terminals penetrating the protective layer; allowing the electrically conductive terminals beneath the protective layer to form with the plurality of electrically conductive structures 23a and 23b for electrically connecting the rectifying elements 203a and the microdie light-emitting elements 20a and 20b with a view to forming the rectifying elements 203a of the Wheatstone Bridge, wherein a DC signal is outputted to the rectification-oriented electrical connection formed by the plurality of microdie light-emitting elements 20a and 20b, thereby allowing light emission to take place.

Related to FIG. 1B, the second fabrication method comprises: providing a substrate 16, forming on the substrate 16 the microdie light-emitting elements 20a, 20b and 20d having at least one active layer 13 by epitaxy, forming on a surface of the microdie light-emitting elements 20a, 20b and 20d a rectifying element-dedicated region 17 by doping a dopant into the surface of a portion of the microdie light-emitting elements 20a, 20b and 20d by ion implantation or diffusion and decreasing the doping concentration thereof; forming on the rectifying element-dedicated region 17 a rectifying unit having at least four rectifying elements 203a forming a Wheatstone bridge circuit; forming a groove by dry etching or wet etching so as to insulate the microdie light-emitting elements 20a, 20b and 20d from one another; enclosing a periphery of the microdie light-emitting elements 20a, 20b and 20d with a protective layer, removing a portion of the protective layer so as to form the plurality of electrically conductive terminals penetrating the protective layer; allowing the electrically conductive terminals beneath the protective layer to form with the plurality of electrically conductive structures 23a and 23b for electrically connecting the rectifying elements 203a and the microdie light-emitting elements 20a and 20b with a view to forming the rectifying elements 203a of the Wheatstone Bridge, wherein a DC signal is outputted to the rectification-oriented electrical connection formed by the plurality of microdie light-emitting elements 20a and 20b, thereby allowing light emission to take place.

The electrically conductive structures 23a and 23b referred to in the two methods for fabricating the alternating current light-emitting device of the present invention are selected from the group consisting of an electrically conductive bridge, a metallic wire-bonding structure, and a transparent metal oxide layer capable of electrical conduction.

The protective layer referred to in the two methods for fabricating the alternating current light-emitting device of the present invention is made of a dielectric material, such as $SiO_x$ and $SiN_x$.

The electrically conductive terminal referred to in the two methods for fabricating the alternating current light-emitting device of the present invention is formed by vapor deposition.

The method for fabricating the alternating current light-emitting device of the present invention comprises forming the rectifying unit on the rectifying element-dedicated member, wherein the rectifying element-dedicated member is formed on the substrate by epitaxy, deposition, diffusion, or implantation. Therefore, the rectifying elements are characterized by high tolerance to a reverse bias and a low starting forward bias, thereby reducing the number of the rectifying elements of the rectifying unit, providing more room for an increased number of microdie light-emitting elements, increasing unit area utilization, and enhancing light emission efficiency. Accordingly, the present invention overcomes a drawback of the prior art, that is, poor tolerance of conventional light-emitting microdies to a reverse bias and a large number of light-emitting microdies required for rectification.

The aforesaid embodiments merely serve as the preferred embodiments of the present invention. The aforesaid embodiments should not be construed as to limit the scope of the present invention in any way. Hence, any other changes can actually be made in the present invention. It will be apparent to those skilled in the art that all equivalent modifications or changes made to the present invention, without departing from the spirit and the technical concepts disclosed by the present invention, should fall within the scope of the appended claims.

What is claimed is:

1. An alternating current light-emitting device, at least comprising:
    a substrate;
    a plurality of microdie light-emitting elements formed on the substrate, each of the microdie light-emitting elements at least being provided with an active layer and an electrically conductive terminal;
    a rectifying element-dedicated member formed on a surface of a portion of the microdie light-emitting elements;
    a rectifying unit formed on the rectifying element-dedicated member, provided with at least four rectifying elements forming a Wheatstone bridge circuit, and adapted to provide rectification and output a direct current signal to each of the microdie light-emitting elements; and
    an electrically conductive structure for electrically connecting the rectifying elements and the microdie light-emitting elements.

2. The alternating current light-emitting device of claim 1, wherein the substrate is one of a chip and an insulated substrate.

3. The alternating current light-emitting device of claim 1, wherein the active layer is a light-emitting active layer.

4. The alternating current light-emitting device of claim 1, wherein the electrically conductive terminal is an Ohmic electrode.

5. The alternating current light-emitting device of claim 1, wherein the rectifying element-dedicated member is a rectifying element-dedicated layer formed by one of epitaxy and deposition.

6. The alternating current light-emitting device of claim 5, wherein the rectifying element-dedicated layer is made of a semiconductive material AlGaN.

7. The alternating current light-emitting device of claim 1, wherein the rectifying element-dedicated member is a rectifying element-dedicated region formed by doping a dopant into the substrate by one of ion implantation and diffusion.

8. The alternating current light-emitting device of claim 7, wherein the dopant is a n-type dopant.

9. The alternating current light-emitting device of claim 1, wherein connection of the microdie light-emitting elements is one selected from the group consisting of series connection, parallel connection, and both.

10. The alternating current light-emitting device of claim 9, wherein each of the microdie light-emitting elements emits light with one of identical wavelengths and different wavelengths.

11. The alternating current light-emitting device of claim 1, wherein the electrically conductive structure is one selected from the group consisting of an electrically conductive bridge, a metallic wire-bonding structure, and a transparent metal oxide layer capable of electrical conduction.

12. The alternating current light-emitting device of claim 1, wherein each of the microdie light-emitting elements comprises a buffer layer, an n-type semiconductor, an active layer, and a p-type semiconductor.

13. The alternating current light-emitting device of claim 1, wherein the microdie light-emitting elements are disposed in a matrix.

14. The alternating current light-emitting device of claim 1, wherein the rectifying element is a Schottky diode.

* * * * *